(12) United States Patent
Cabral, Jr. et al.

(10) Patent No.: US 8,426,236 B2
(45) Date of Patent: Apr. 23, 2013

(54) METHOD AND STRUCTURE OF PHOTOVOLTAIC GRID STACKS BY SOLUTION BASED PROCESSES

(75) Inventors: Cyril Cabral, Jr., Mahopac, NY (US); Harold J. Hovel, Katonah, NY (US); Xiaoyan Shao, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 397 days.

(21) Appl. No.: 12/775,939

(22) Filed: May 7, 2010

(65) Prior Publication Data

US 2011/0272009 A1    Nov. 10, 2011

(51) Int. Cl.
*H01L 21/00* (2006.01)
(52) U.S. Cl.
USPC .............. 438/57; 257/E27.125; 257/E27.126; 136/244; 136/256
(58) Field of Classification Search ............ 438/57, 438/66, 98; 136/243, 256; 257/E27.125, 257/E27.126
See application file for complete search history.

(56) References Cited

U.S. PATENT DOCUMENTS

| | | | |
|---|---|---|---|
| 4,609,565 A | | 9/1986 | Yates |
| 4,612,698 A | | 9/1986 | Gonsiorawski et al. |
| 4,818,337 A | * | 4/1989 | Barnett et al. ............... 136/256 |
| 4,927,770 A | | 5/1990 | Swanson |
| 5,011,565 A | * | 4/1991 | Dube et al. ..................... 438/98 |
| 5,011,567 A | | 4/1991 | Gonsiorawski |
| 6,332,684 B1 | | 12/2001 | Shibatani et al. |
| 7,217,655 B2 | | 5/2007 | Cabral, Jr. et al. |
| 7,276,801 B2 | | 10/2007 | Dubin et al. |
| 7,338,585 B2 | | 3/2008 | Akolkar et al. |
| 7,339,110 B1 | | 3/2008 | Mulligan et al. |
| 7,405,157 B1 | | 7/2008 | Reid et al. |
| 7,459,373 B2 | | 12/2008 | Yoo |
| 7,465,384 B2 | | 12/2008 | Levey et al. |

* cited by examiner

*Primary Examiner* — Brook Kebede
(74) *Attorney, Agent, or Firm* — Novak Druce Connolly Bove + Quigg LLP; Louis J. Percello, Esq.

(57) ABSTRACT

A grid stack structure of a solar cell, which includes a silicon substrate, wherein a front side of the silicon is doped with phosphorus to form a n-emitter and a back side of the silicon is screen printed with aluminum (Al) metallization; a dielectric layer, which acts as an antireflection coating (ARC), applied on the silicon; a mask layer applied on the front side to define a grid opening of the dielectric layer, wherein an etching method is applied to open an unmasked grid area; a light-induced plated nickel or cobalt layer applied to the front side with electrical contact to the back side Al metallization; a silicide layer formed by rapid thermal annealing of the plated nickel (Ni) or cobalt (Co); an optional barrier layer electrodeposited on the silicide; a copper (Cu) layer electrodeposited on the silicide/barrier film layer; and a thin protective layer is chemically applied or electrodeposited on top of the Cu layer.

13 Claims, 1 Drawing Sheet

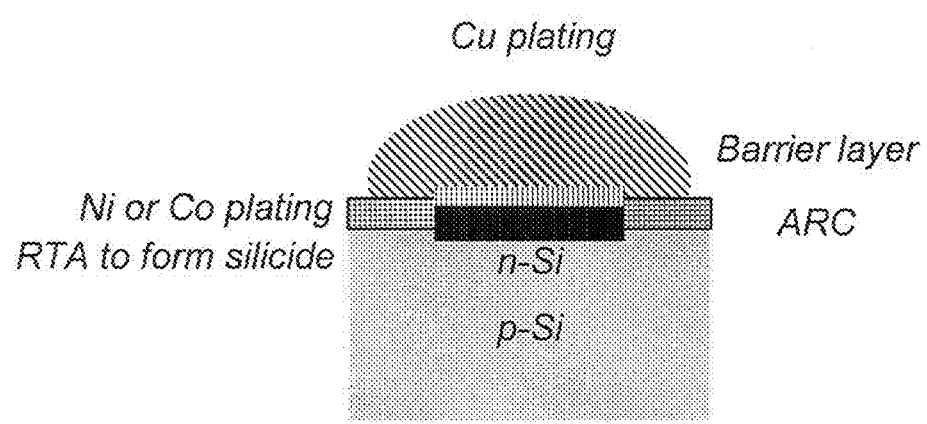

METHOD AND STRUCTURE OF PHOTOVOLTAIC GRID STACKS BY SOLUTION BASED PROCESSES

TECHNICAL FIELD

This disclosure relates to solar cells, specifically it relates to solar cell grid structures and methods of fabricating solar cell grid structures.

BACKGROUND OF THE DISCLOSURE

The silicon photovoltaic industry widely uses screen printing of aluminum/silver (Al/Ag) based paste for grid metallization. The main disadvantage of this technology is the difficulty in making smaller conduction lines and the high contact resistance of the paste conductor. The smallest width of screening printed conduction lines is on the order of 100 microns. In addition, screen printing can only print low aspect ratio features, which translates into wider conduction lines in order to provide sufficient conductivity, which means more shadowing for the front-side grid. Al/Ag paste is also a very expensive material and the screen printing process is the leading cause of wafer cracking in the solar cell building processes.

A method described in U.S. Pat. No. 7,339,110 to Sunpower uses vacuum based processes to deposit a seed layer and the barrier layer before Cu plating. The combination of vacuum and solution processes for the conventional solar cell is cost prohibitive. Thus, Sunpower uses it in the interdigitated single crystalline silicon solar cells, which will yield higher efficiency at a higher cost to justify the high cost processes.

Solar cells with interdigitated contacts of opposite polarity on the back surface of the cell generally differ from conventional solar cells with front side metal grids and blanket or grid metallized back side contacts. These solar cells improved photo-generation due to elimination of front grid shading, reduced grid series resistance, and improved blue photo-response since heavy front surface doping is not required to minimize front contact resistance because there are no front contacts. As described in U.S. Pat. No. 4,927,770 to Swanson, the back-contact cell structure allows simplified module assembly due to coplanar contacts.

While interdigitated back-contact (IBC) solar cells have been fabricated, cost considerations have prevented the IBC solar cell from commercialization. Thus, conventional microelectronics (integrated circuit) processing has been employed in fabricating IBC solar cells, including the use of backside diffusions, contacts, and metal lines fabricated by conventional microelectronics photolithography, thin film metallization, and etching processes. However, the process is not cost effective for application in conventional low-cost, flat-plate solar panels.

BRIEF SUMMARY OF THE DISCLOSURE

In accordance with the invention, a grid stack structure of a solar cell is provided which can be readily manufactured using a solution-based processing technique, which includes electroplating, which is efficient in operation and economical to manufacture. The solution-based processing techniques includes electroplating, in which the grid structure can be made narrower and taller with electroplated lines compared with convention screen printed conducting lines. An aspect of process of the present disclosure includes light induced plating to apply a thin metal layer, which may include Ni or Co. A silicide layer is formed by rapid thermal annealing, which provides a silicide contact to silicon. Then, an optional diffusion barrier layer is deposited with solution-based processes, which may include electroplated NiP, CoP, and CoWP. Subsequently, a thick layer of Cu is electroplated with close to zero stress, which minimizes stress on the stack for good mechanical strength.

BRIEF DESCRIPTION OF THE DRAWINGS

FIG. 1 is an illustration of a side view of a structure of a grid stack in accordance with the present disclosure.

DETAILED DESCRIPTION OF THE DISCLOSURE

A more complete appreciation of the disclosure and many of the attendant advantages will be readily obtained, as the same becomes better understood by reference to the following detailed description when considered in connection with the accompanying drawings.

A solar cell grid structure in accordance with the disclosure is manufactured in a single crystalline silicon substrate/wafer or in a multi-crystalline silicon substrate. FIG. 1 shows the structure and process sequence as follows:

1. A p-silicon substrate may be used;
2. The silicon surface is textured to give certain roughness for maximum light absorption; The front side of the silicon is then doped with phosphorus to make a thin n-emitter, with a thickness range of 100 nm to 1 micron;
   Backside Al metallization is screen printed and fired at high temperature in the range of 600 to 900 degree centigrade;
3. A dielectric layer, which acts as an antireflection coating (ARC), such as silicon nitride, silicon oxide, is deposited on the n-emitter;
4. A mask is applied on the front side to define the grid opening of the dielectric layer;
5. An etching method is applied to open the unmasked grid area;
   Nickel (Ni) or cobalt (Co) is light-induced plated with electrical contact to the back side Al, using various plating solutions, including sulfate-based, sulfamate-based, or chloride-based acidic plating solutions, with the light intensity ranging from 1,000 lux to 100,000 lux to generate free electrons for electroplating on the front grid;
6. The mask layer is stripped;
7. Rapid thermal annealing of the plated Ni or Co is applied to form a thin layer of silicide between 250° C. to 600° C. in the range of 10 seconds to 20 minutes;
8. An optional barrier layer is deposited on the silicide, which may include NiP, CoP, CoWP, and combinations thereof using either electroless or electroplating, using hypophosphite based salt as a source of P incorporation in addition to Ni, Co, and W salts;
9. A thick Cu layer is deposited on top of the silicide/barrier film, using plating baths and conditions to give low stress;
   An optional thin protective layer is deposited on top of Cu for protection, such as an absorbed benzotriazole (BTA) layer from BTA solution rinse, or for improved soldering compatibility to electrodeposit a thin layer of silver (Ag) or tin (Sn).

In a preferred embodiment, the wafer is etched using KOH or NaOH to remove solid damage from ingot wafering. About 20 to 50 μm of silicon may be removed. After the etch, the wafer is cleaned using a standard wet cleaning sequence.

In a preferred embodiment, a textured surface is formed in the top surface of the single crystalline substrate. The distribution of apexes typically ranges from 1 to 10 µm in height. This random texture assists in the coupling of light into the solar cell.

For wafers that are not single crystal, texture can also be created by several alternative methods, including acid etching, plasma etching, and mechanical abrasion. Following the texturing, the wafers may be cleaned using a standard pre-diffusion wet cleansing sequence.

In another preferred embodiment, a liquid phosphorous source ($H_3PO_4$ solution) or a gas source ($POCl_3$) is used as a dopant source. Other n+ dopants, such as As or Sb, may be used.

In another preferred embodiment, the ARC, such as SiN or $TiO_2$ is applied to the front surface of the solar cell. This coating assists in the coupling of light into the solar cell and hence improves efficiency. Alternatively, the ARC may be deposited after deposition of the seed metal stack. Further, the ARC may be applied to both sides of substrate.

In another preferred embodiment, an Al layer is coated on the back side by screen printing and fired to form a p+ layer and act as the conductor. The aluminum in the preferred embodiment makes ohmic contact to the semiconductor material and acts as a back surface reflector.

In thin silicon solar cells, weakly absorbed infrared radiation passes through the thickness of silicon and is often lost by absorption in backside metallization. The front surface texture in combination with the back surface reflector can increase the optical path. This design feature leads to higher photo-generated current in the solar cell.

In another preferred embodiment, a patterned resist is then applied over the front side on ARC layer. The resist mask defines a grid opening of the dielectric layer, wherein an etching method is applied to open the grid area.

A light induced plated nickel (Ni) or cobalt (Co) layer applied to the front side grid with electrical contact to the back side Al metallization.

A silicide layer formed by rapid thermal annealing of the plated Ni or Co.

A second layer, in a preferred embodiment acts as a diffusion barrier to metals and other impurities In the preferred embodiment, the barrier layer is selected from the group consisting of NiP, CoP, CoWP, and combinations thereof. The barrier layer is deposited on the silicide using either electroless or electroplating. Alternatively, chromium (Cr) may be used as the barrier layer.

A thick layer of copper (Cu) in a preferred embodiment is electrodeposited on the grid using the same light induced method by making electrical contact to the back side Al metallization In a preferred embodiment, a thin layer, which may include benzotriazole (BTA), or electroplated Ag or Sn, may be added after the Cu to improve solderability and/or to prevent corrosion of plated areas.

Advantages of the structure and process of this disclosure include solution based processes for cost competitiveness, low temperature processes, good conductivity, easy to maintain thickness and aspect ratio of the cross-section of the conduction lines, and minimal shadowing.

Obviously, numerous modifications and variations of the disclosure are possible in light of the above disclosure. It is therefore understood that within the scope of the appended claims, the disclosure may be practiced otherwise than as specifically described herein.

What is claimed is:

1. A method of a grid stack structure of a solar cell comprising:
   texturing a surface of a silicon substrate;
   doping a front side of the silicon with phosphorus to make a n-emitter;
   screen printing a back side of the silicon substrate with aluminum (Al) metallization and fired at high temperature;
   depositing a dielectric layer, which acts as an antireflection coating (ARC) on the n-emitter;
   applying a mask on the front side to define the grid opening of the dielectric layer;
   etching to open the unmasked grid area;
   light-induced plating on the front side grid with electrical contact to the backside Al;
   stripping the mask layer;
   rapid thermal annealing the light induced plated layer to form a thin layer of silicide;
   depositing a barrier layer on the silicide;
   depositing a layer of Cu on top of the silicide/barrier film; and
   depositing a protective layer on top of the Cu layer.

2. The method according to claim 1, wherein the substrate is a single crystalline silicon substrate/wafer having a (100) crystalline orientation.

3. The method according to claim 1, wherein the substrate is a multi-crystalline silicon substrate.

4. The method according to claim 1, wherein etching is applied to open the unmasked grid area.

5. The method according to claim 1, wherein the light-induced plated layer comprises Ni.

6. The method according to claim 1, wherein the light-induced plated layer comprises Co.

7. The method according to claim 1, wherein the Al metallization is screen printed and fired at high temperature.

8. The method according to claim 1, wherein the dielectric layer is selected from the group consisting of silicon nitride, silicon oxide, and a combination thereof.

9. The method according to claim 1, wherein the dielectric layer is deposited on the n-emitter.

10. The method according to claim 1, wherein the rapid thermal annealing of the plated Ni or Co is applied to form a thin layer of silicide between 250° C. to 600° C. in the range of 10 seconds to 10 minutes.

11. The method according to claim 1, wherein the barrier layer is selected from the group consisting of NiP, CoP, CoWP, and combinations thereof.

12. The method according to claim 1, wherein the barrier layer is deposited on the silicide using either electroless or electroplating.

13. The method according to claim 1, wherein the Cu layer is electrodeposited on top of the silicide/barrier film using plating baths.

* * * * *